United States Patent
Conti et al.

(10) Patent No.: US 6,570,256 B2
(45) Date of Patent: May 27, 2003

(54) CARBON-GRADED LAYER FOR IMPROVED ADHESION OF LOW-K DIELECTRICS TO SILICON SUBSTRATES

(75) Inventors: Richard A. Conti, Mount Kisco, NY (US); Prakash Chimanlal Dev, Plano, TX (US); David M. Dobuzinsky, New Windsor, NY (US); Daniel C. Edelstein, White Plains, NY (US); Gill Y. Lee, Wappingers Falls, NY (US); Kia-Seng Low, Hopewell Junction, NY (US); Padraic C. Shafer, Beacon, NY (US); Alexander Simpson, Wappingers Falls, NY (US); Peter Wrschka, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/910,380

(22) Filed: Jul. 20, 2001

(65) Prior Publication Data

US 2003/0017642 A1 Jan. 23, 2003

(51) Int. Cl.$^7$ ...................... H01L 23/48; H01L 21/4763
(52) U.S. Cl. ........................ 257/761; 257/760; 257/752; 257/72; 257/762; 257/767; 438/624; 438/622
(58) Field of Search .................... 438/99, 780, 761, 438/762, 763, 624, 622; 257/760, 752, 72, 761, 762, 767

(56) References Cited

U.S. PATENT DOCUMENTS

| | | | |
|---|---|---|---|
| 5,885,751 A | | 3/1999 | Weidman et al. |
| 5,904,952 A | | 5/1999 | Lopata et al. |
| 5,945,155 A | * | 8/1999 | Grill et al. .................. 427/122 |
| 5,981,000 A | * | 11/1999 | Grill et al. ............... 427/249.7 |
| 6,054,379 A | | 4/2000 | Yau et al. |
| 6,059,935 A | | 5/2000 | Spence |
| 6,072,227 A | | 6/2000 | Yau et al. |
| 6,087,009 A | | 7/2000 | Bultykhanova |
| 6,090,530 A | | 7/2000 | Weidman et al. |
| 6,340,435 B1 | * | 1/2002 | Bjorkman et al. ............ 216/13 |
| 6,346,747 B1 | * | 2/2002 | Grill et al. ................... 257/752 |
| 6,362,091 B1 | * | 3/2002 | Andideh et al. ............ 438/624 |
| 6,407,011 B1 | * | 6/2002 | Ikeda et al. ................. 257/760 |
| 6,429,122 B2 | * | 8/2002 | Chooi et al. ................ 438/622 |

* cited by examiner

*Primary Examiner*—Matthew Smith
*Assistant Examiner*—Victor V Yevsikov
(74) *Attorney, Agent, or Firm*—McGinn & Gibb, PLLC; Todd M. C. Li, Esq.

(57) ABSTRACT

A structure and method for an insulator layer having carbon-graded layers above a substrate is disclosed, wherein the concentration of carbon increases in each successive carbon-graded layer above the substrate. The insulator comprises a low-k dielectric having a dielectric constant less than 3.3. The carbon-graded layer increases adhesion between the substrate and the insulator and between the insulator and the conductor layer. The structure may also include stabilization interfaces between the carbon-graded layers. More specifically, the carbon-graded layers include a first layer adjacent the substrate having a carbon content between about 5% and 20%, a second layer above the first layer having a carbon content between about 10% and 30%, and a third layer above the second layer having a carbon content between about 20% and 40%.

11 Claims, 2 Drawing Sheets

CARBON-GRADED LAYER FOR IMPROVED ADHESION OF LOW-K DIELECTRICS TO SILICON SUBSTRATES

BACKGROUND OF THE INVENTION

1. Field of the Invention

The present invention generally relates to the formation of insulating layers on substrates, and more particularly to a carbon-graded layer that improves the adhesion between low-k dielectrics and substrates.

2. Description of the Related Art

Insulating layers are used to separate conductor and semiconductor layers within semiconductor devices. Recently, low-k dielectrics have become popular because they create less capacitance between and around the conductors and are more easily applied than conventional silicon oxide dielectrics, which have higher dielectric constants. The recent progress in low-k dielectrics using CVD techniques offers more affordable and attractive dielectric options to the advanced interconnect technologies. For example, by employing CVD low-k with a dielectric constant of 2.7 at the wiring level, the total capacitance and RC delay can be significantly reduced.

However, one disadvantage of using low-k dielectrics is the poor adhesion between the low-k dielectrics and the underlying substrate. Conventional methods typically form low-k dielectric films through either spin on processes or Plasma Enhanced Chemical Vapor Deposition (PECVD) of organosilane gases, such as amorphous hydrogenated carbon doped oxide (a-SiCO;H), etc. However, such gases have poor chemical adhesion to substrates, such as silicon dioxide, silicon nitride, silicon carbide, silicon, tungsten, aluminum, and copper substrates. Because of this low structural adhesion, low-k dielectric layer are often delaminated from the underlying substrate, which leads a failure of interconnect processes. One of the conventional methods to improve the adhesion between low-k dielectric layers and underlying substrates is the use of an adhesion promoter. However, an adhesion promoter is often used for spin on dielectric (SOD) low-k rather than PECVD processes, which requires the use of a precursor such as methylsilane (1MS) trimethylsilane (3MS), tetramethylsilane (4MS), tetramethylcyclotetrasiloxane (TMCTS), and orthomethylcyclotetrasiloxane (OMCTS). However, such low-k films, in general, have a hydrophobic surface with high wetting angles with water. This causes these films to have a very poor adhesion with substrate layers.

Therefore, there is a need for a structure and method that improves the adhesion between low-k dielectrics and their corresponding substrates.

SUMMARY OF THE INVENTION

It is, therefore, an object of the present invention to provide a structure and method for an insulator layer having carbon-graded layers above a substrate, wherein the concentration of carbon increases in each successive carbon-graded layer above the substrate. The insulator comprises a low-k dielectric having a dielectric constant less than 3.3 (preferably 2.7). The carbon-graded layer increases adhesion between the substrate and the insulator and between the insulator and the conductor layer. The process may also include stabilization steps between the carbon-graded layer deposition steps. More specifically, the carbon-graded layers include a first layer adjacent the substrate having a carbon content between about 5% and 20%, a second layer above the first layer having a carbon content between about 10% and 30%, and a third layer above the second layer having a carbon content between about 20% and 40%.

The invention also includes a method of forming a semiconductor structure having an insulating layer comprising forming a substrate, depositing a layer containing a concentration of carbon on the substrate and repeating the depositing process forming successive carbon-graded layers over one another using increasing concentrations of carbon to form the insulator layer. More specifically, the depositing process comprises flowing a gas containing carbon element and a gas containing oxygen in a chamber to form a low-k dielectric having a dielectric constant less than 3.3. The invention increases a flow rate of the carbon containing gas and decreases a flow rate of the inert gas to increase the carbon concentration in each successive carbon-graded layer while the total gas flow of the carbon containing gas and inert gas flow is kept at a constant flow rate.

The invention overcomes the problem of poor adhesion between low-k dielectrics and substrates by forming a carbon-graded area between the low-k dielectric and the underlying substrate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

The invention overcomes the problem of poor adhesion between low-k dielectrics and substrates by forming a carbon-graded area between the low-k dielectric and the underlying substrate. One embodiment of the invention is shown in flowchart form in FIG. 1 and the unique structure produced by the process shown in FIG. 1 is shown in schematic form in FIG. 2.

Figure 2:
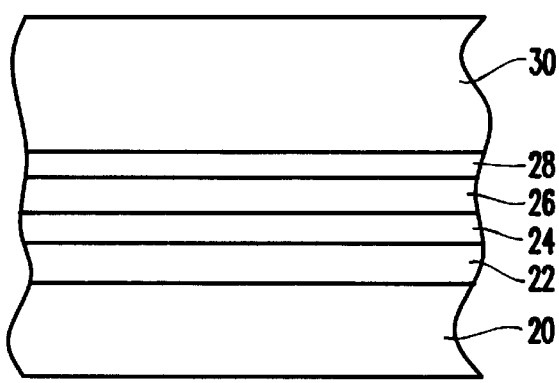
FIG. 2 is a schematic diagram showing the carbon-grading achieved with the invention.

The invention begins with the underlying substrate 20, shown in FIG. 2. The underlying substrate could be any common substrate used in integrated circuit chips. For example, the substrate could comprise a pure silicon substrate (single crystal or polycrystal), silicon dioxide substrate, silicon nitride substrate, silicon carbide substrate, tungsten substrate, aluminum substrate, copper substrate, etc.

The invention utilizes well-known materials such as 1MS, 3MS, 4MS, TMCTS, OMCTS, etc and with or without oxygen and/or carbon dioxide as an oxidizer. However, the invention employs a multi-step deposition process that gradually increases the concentration of such gases in successive layers above the substrate 20. This produces a structure that has multiple layers of differing organic concentrations (graded-carbon layers). These different layers can conceptually be thought of as a single graded layer where the carbon concentration gradually increases as the distance moves away from the substrate.

Figure 1:
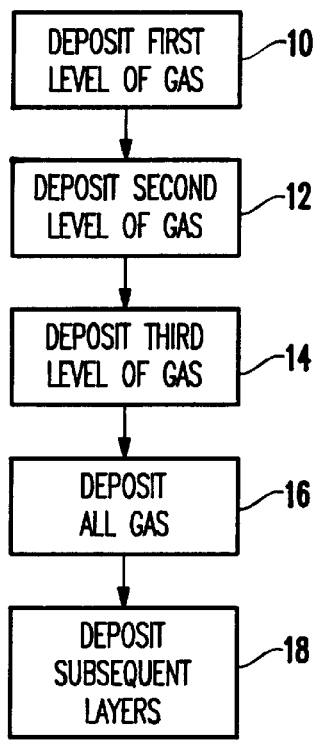
FIG. 1 is a flow diagram illustrating a preferred method of the invention.

More specifically, as shown in item 10 in FIG. 1, the invention starts the multi-step deposition process by introducing a first amount of organic gas or gases to form a first layer 21 on top of the substrate 20. For example, the first layer 10 could include approximately 5–20% of carbon concentration by using a specific flow rate (30 sccm to 120 sccm) which is increased in the subsequent steps 12, 14, and 16. Each processing step also preferably uses an oxygen gas as an oxidizer (about 100 sccm).

Next, in items 12, 14, and 16, similar deposition processes are performed; However, the percentage of organic gas is increased in each succeeding step (or the flow rate is increased for the same length deposition process). For example, the percentage of organic gas can be increased to about 10–30% (30 sccm–120 sccm) with 70–90% inert gas in item 12 producing layer 22, and again increased to about 20–40% (120 sccm–240 sccm) with 60–80% inert gas in item 14, producing layer 23. Finally, in step 16, a full flow of the organic gas is deposited (600 sccm) with no inert gas, producing layer 24. Finally, as shown in item 14, subsequent layer 25 (e.g., conductor) is deposited using well-known materials and methods. Thus, the carbon graded layers 22, 24, 26 form a low-k dielectric that has good adhesion to the substrate and the overlying conductor layer.

In the foregoing, the processing pressure in the reactor chamber can be any standard operating pressure and is preferably between about 1 Torr to about 10 Torr and is preferably about 4 Torr. A frequency RF power source can be used in the power source is preferably between about 300 watts and 1000 wants and is preferably about 600 watts. Any frequency and combination of RF powers can be used for bias power for sputtering in a range of between 0 watts and about 500 watts, and preferably about 0 watts. The temperature range is preferably about 250â C–550â C. The thickness of the first 22, second 24 and third 26 layers can be any design thickness and are preferably between about 10A and 150A. Therefore, the total thickness of the carbon-graded layer can be any thickness and is preferably between about 50A and 450A. Further, while three carbon-graded layers are shown in FIG. 2, as would be known by one ordinarily skilled in the art, the invention is not limited to this number of layers. To the contrary any number of layers that would be applicable to a given design can be used with the invention. Low-k dielectric film has usually hydrophobic surface while most of substrate materials have hydrophilic surfaces. The hydrophobicity of low-k dielectrics is caused by high organic carbon concentration. Hence, by changing carbon concentration the gradual change from hydrophilic to hydrophobic contributes to the improvement of adhesion.

In addition, the formation of the different layers 22, 24, 26 can be skipped independently of each other, which may affect the adhesion strength.

In addition, to the carbon-graded layer or in its substitution, a helium and/or oxygen plasma treatment can be used for the promotion of adhesion. It could further improve the adhesion by changing surface morphology of underlying substrate and/or cleaning the surface prior to the deposition.

Figure 3:
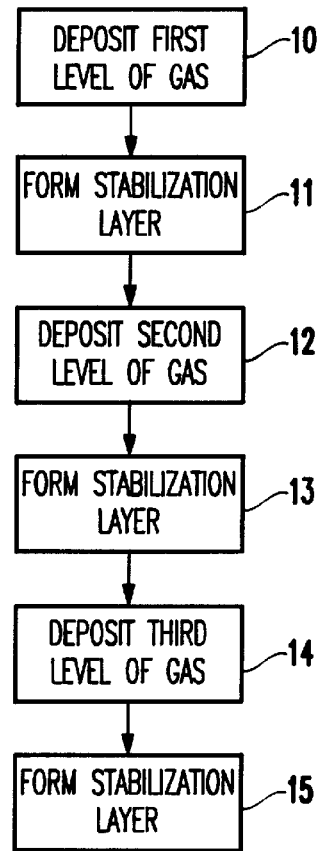
FIG. 3 is a flow diagram illustrating a second preferred method of the invention.
Figure 3:
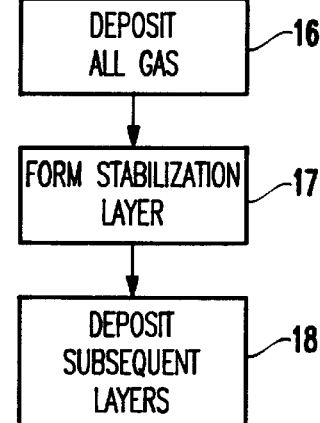
Figure 4:
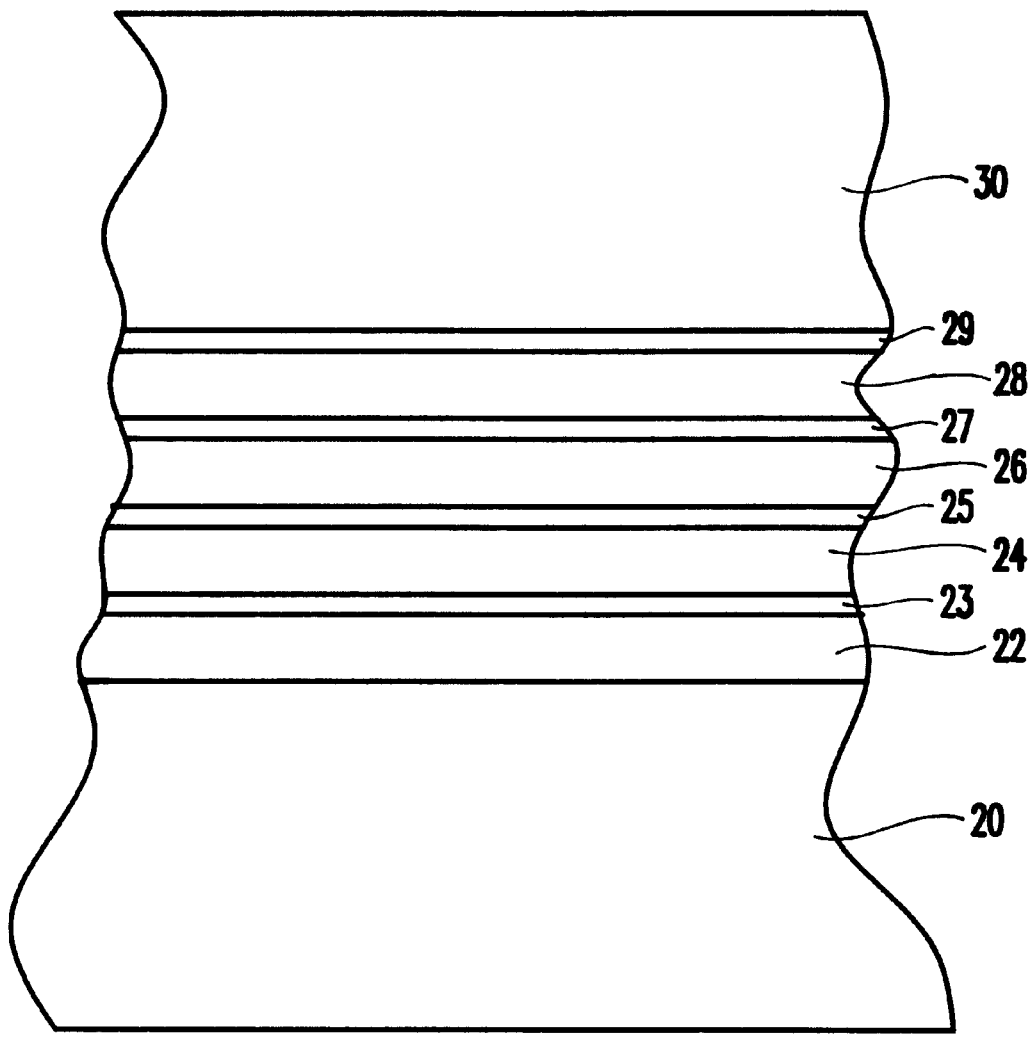
FIG. 4 is a schematic diagram showing the carbon-grading with stabilization layers according to the invention.

A second embodiment of the invention is shown in FIGS. 3–4. The flowchart in FIG. 3 is similar to the flowchart shown in FIG. 1 except that between each of the depositing steps 10, 12, 14, 16, 18 interfaces 11, 13, 15, 17 created by the stabilization formation steps have been included. As shown in the structure shown FIG. 4, this results in stabilization layers 23, 25, 27, 29 being formed within the structure. The stabilization process is just a step in between two adjacent deposition steps and does create a layer of any substance; however, it is possible to observe the interface between two layers that are created by the stabilization step. The purpose of the stabilization is to avoid a sudden change in gas flow during deposition process.

The stabilization steps are necessary if the total flow of gas is changed within the chamber. In the first embodiment, the flow rate of gas is kept constant and as additional carbon gas is introduced into the chamber, the volume rate flow of inert gas is correspondingly reduced. However in some situations it may not be possible to keep the flow rate constant. For example, if you change the process gas flow during plasma deposition it might cause a particulate, film quality, uniformity problems. These situations would find benefit in the second embodiment of the invention because the stabilization steps prevent the layer that has just been formed from being improperly influenced by the subsequent different flow rate.

The invention overcomes the problem of poor adhesion between low-k dielectrics and substrates by forming a carbon-graded area between the low-k dielectric and the underlying substrate.

While the invention has been described in terms of preferred embodiments, those skilled in the art will recognize that the invention can be practiced with modification within the spirit and scope of the appended claims.

What is claimed is:

1. A semiconductor structure comprising:
   a substrate; and
   an insulator layer having carbon-graded layers above said substrate;
   wherein a concentration of carbon increases in each successive carbon-graded layer above said substrate.

2. The semiconductor structure in claim 1, wherein said insulator comprises a low-k dielectric having a dielectric constant less than 3.3.

3. The semiconductor structure in claim 1, further comprising a conductor over said insulator layer.

4. A semiconductor structure comprising:
   a substrate;
   an insulator layer having carbon-graded layers above said substrate; and
   a conductor over said insulator layer,
   wherein a concentration of carbon increases in each successive carbon-graded layer above said substrate, and
   wherein said carbon-graded layer increases adhesion between said substrate and said insulator and between said insulator and said conductor layer.

5. A semiconductor structure comprising:
   a substrate;
   an insulator layer having carbon-graded layers above said substrate, wherein a concentration of carbon increases in each successive carbon-graded layer above said substrate; and
   stabilization layers between said carbon-graded layers.

6. A semiconductor structure comprising:
   a substrate; and
   an insulator layer having carbon-graded layers above said substrate;
   wherein a concentration of carbon increases in each successive carbon-graded layer above said substrate,
   wherein said carbon-graded layers comprise:
   a first layer adjacent said substrate having a carbon content between about 5% and 20%;

a second layer above said first layer having a carbon content between about 10% and 30%; and a third layer above said second layer having a carbon content between about 20% and 40%.

7. A semiconductor structure comprising:

a substrate;

an insulator layer having carbon-graded layers above said substrate; and stabilization interface areas between said carbon-graded layers, wherein a concentration of carbon increases in each successive carbon-graded layer above said substrate.

8. The semiconductor structure in claim 7, wherein said insulator comprises a low-k dielectric having a dielectric constant less than 3.3.

9. The semiconductor structure in claim 7, further comprising a conductor over said insulator layer.

10. The semiconductor structure in claim 7, wherein said carbon-graded layer increases adhesion between said substrate and said insulator and between said insulator and said conductor layer.

11. The semiconductor structure in claim 7, wherein said carbon-graded layers comprise:

a first layer adjacent said substrate having a carbon content between about 5% and 20%;

a second layer above said first layer having a carbon content between about 10% and 30%; and a third layer above said second layer having a carbon content between about 20% and 40%.

* * * * *